United States Patent
Kang et al.

(10) Patent No.: US 11,574,920 B2
(45) Date of Patent: Feb. 7, 2023

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Byung Woo Kang, Incheon (KR); Sae Jun Kwon, Seoul (KR); Seung Min Lee, Hwaseong-si (KR); Hwal Pyo Kim, Suwon-si (KR); Jin Taek Park, Suwon-si (KR); Seung Woo Han, Hwaseong-si (KR); Young Ock Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 243 days.

(21) Appl. No.: 16/872,032

(22) Filed: May 11, 2020

(65) Prior Publication Data
US 2021/0091109 A1    Mar. 25, 2021

(30) Foreign Application Priority Data
Sep. 25, 2019    (KR) .......................... 10-2019-0118246

(51) Int. Cl.
*H01L 27/11582* (2017.01)
*H01L 27/11556* (2017.01)
*H01L 27/24* (2006.01)

(52) U.S. Cl.
CPC .. *H01L 27/11582* (2013.01); *H01L 27/11556* (2013.01); *H01L 27/249* (2013.01); *H01L 27/2454* (2013.01)

(58) Field of Classification Search
CPC ......... H01L 27/11582; H01L 27/11556; H01L 27/2454; H01L 27/249; H01L 27/11565; H01L 27/11575; H01L 27/11524; H01L 27/1157; H01L 21/76813; H01L 21/76831; H01L 21/76837; H01L 21/76897; H01L 27/11521; H01L 27/11568
See application file for complete search history.

(56) References Cited

U.S. PATENT DOCUMENTS

| 9,627,403 | B2 | 4/2017 | Liu et al. | |
| 9,853,051 | B1* | 12/2017 | Lee | ..................... H01L 23/5283 |
| 2017/0263556 | A1* | 9/2017 | Tessariol | ........... H01L 27/11575 |
| 2017/0352678 | A1* | 12/2017 | Lu | ....................... H01L 27/1157 |
| 2019/0139974 | A1* | 5/2019 | Sugawara | ......... H01L 27/11582 |
| 2019/0378857 | A1* | 12/2019 | Lee | .................. H01L 27/11521 |
| 2021/0272900 | A1* | 9/2021 | Shin | .................. H01L 21/76895 |

FOREIGN PATENT DOCUMENTS

KR    1020170014757 A    2/2017

* cited by examiner

*Primary Examiner* — Allison Bernstein
(74) *Attorney, Agent, or Firm* — William Park & Associates Ltd.

(57) ABSTRACT

A semiconductor device includes: a stack structure including a cell region and a contact region; a channel structure penetrating the cell region of the stack structure; trenches penetrating the contact region of the stack structure to different depths; and a stop structure penetrating the contact region of the stack structure, the stop structure being located between the trenches.

19 Claims, 19 Drawing Sheets

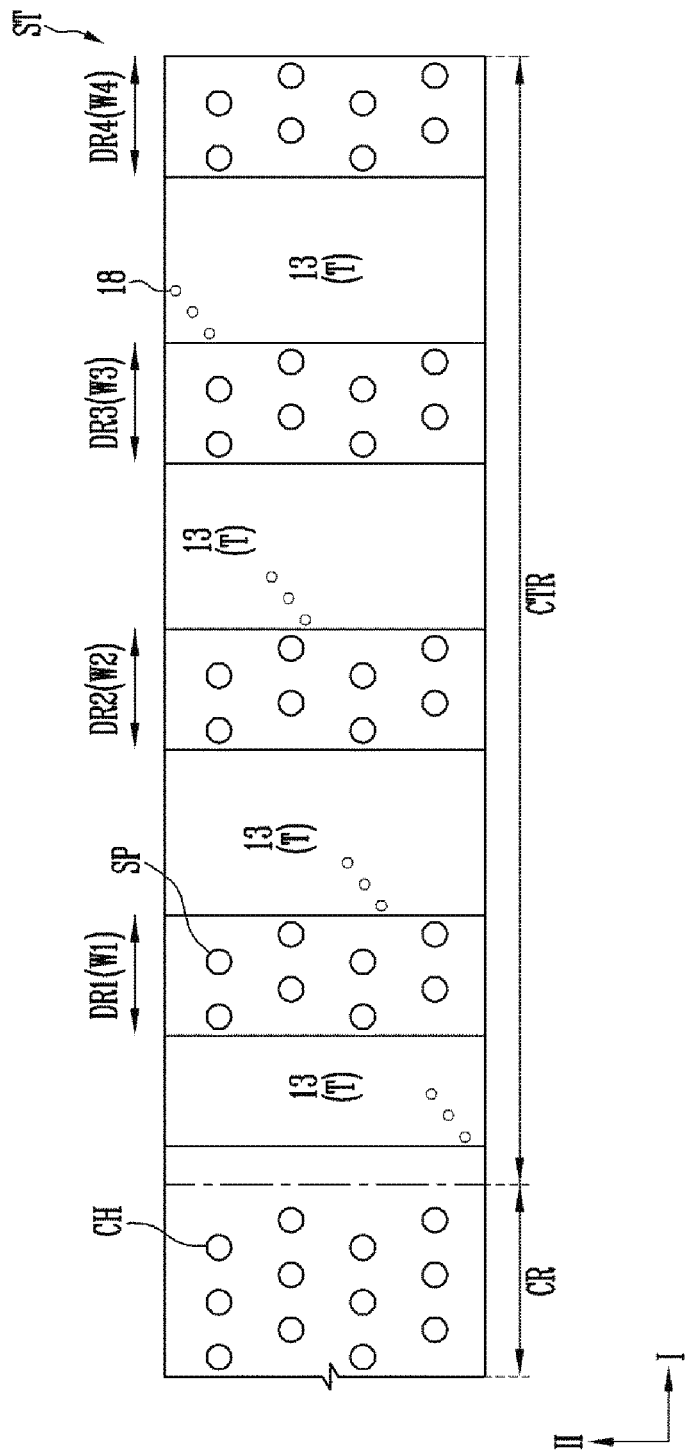

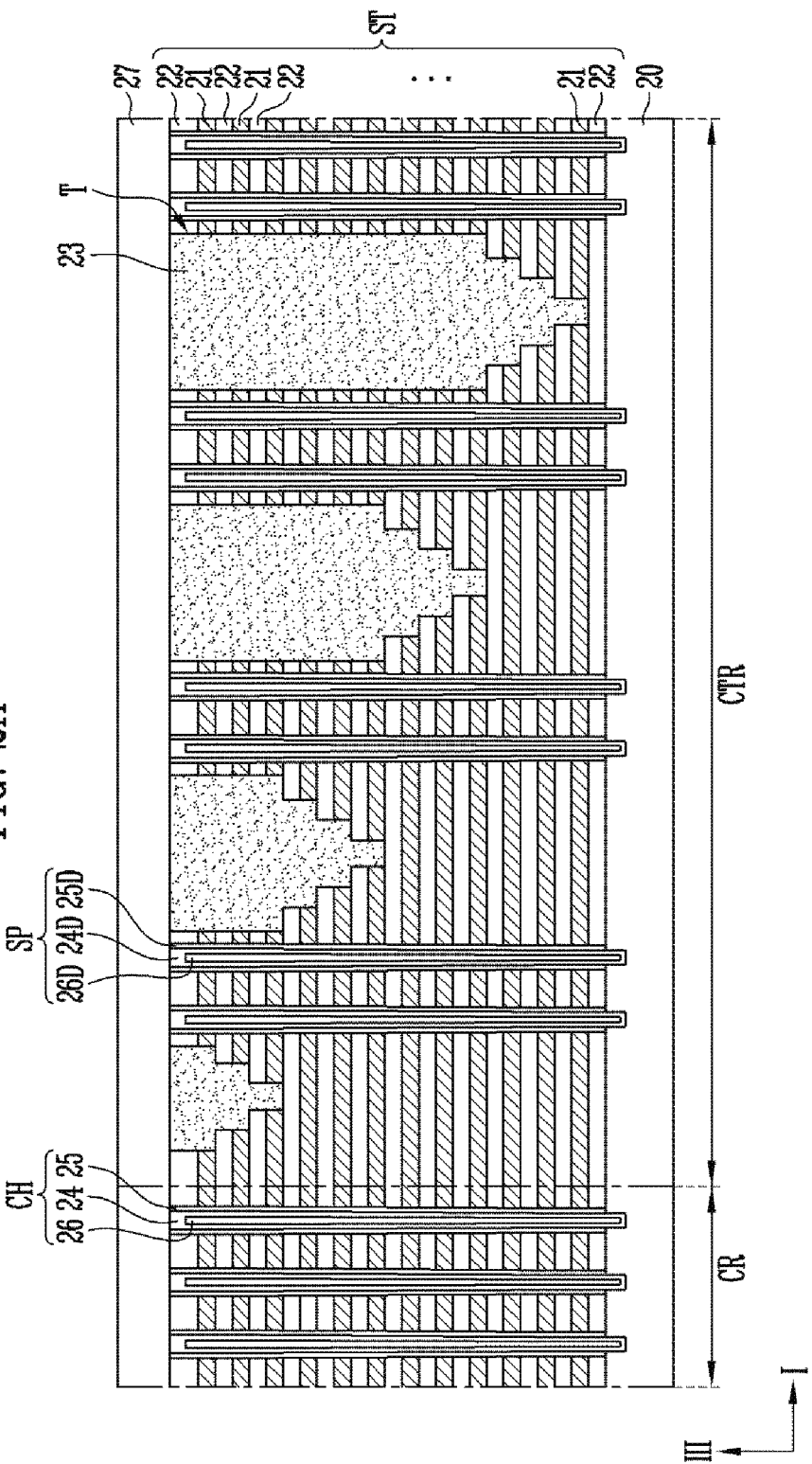

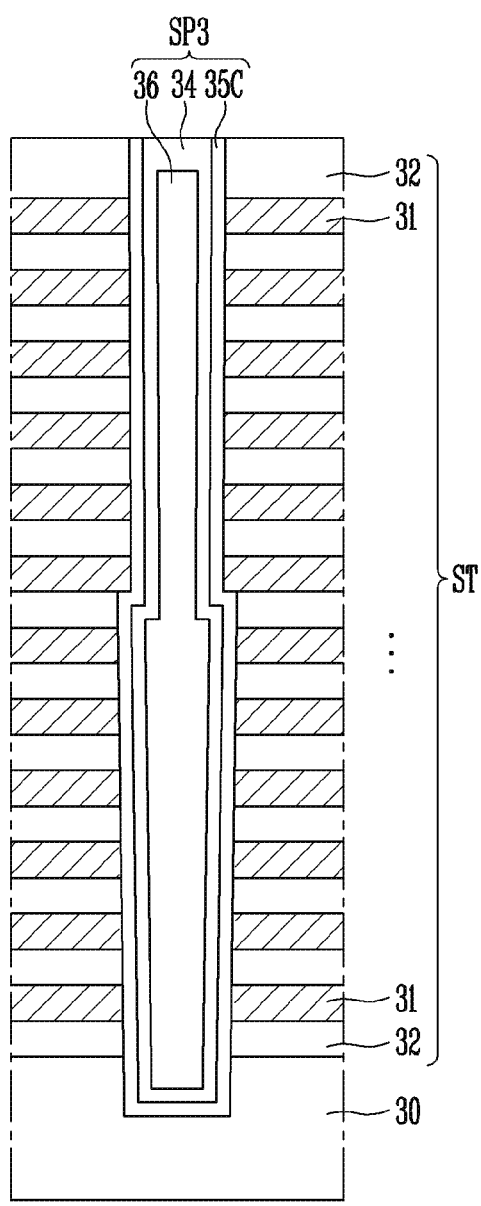

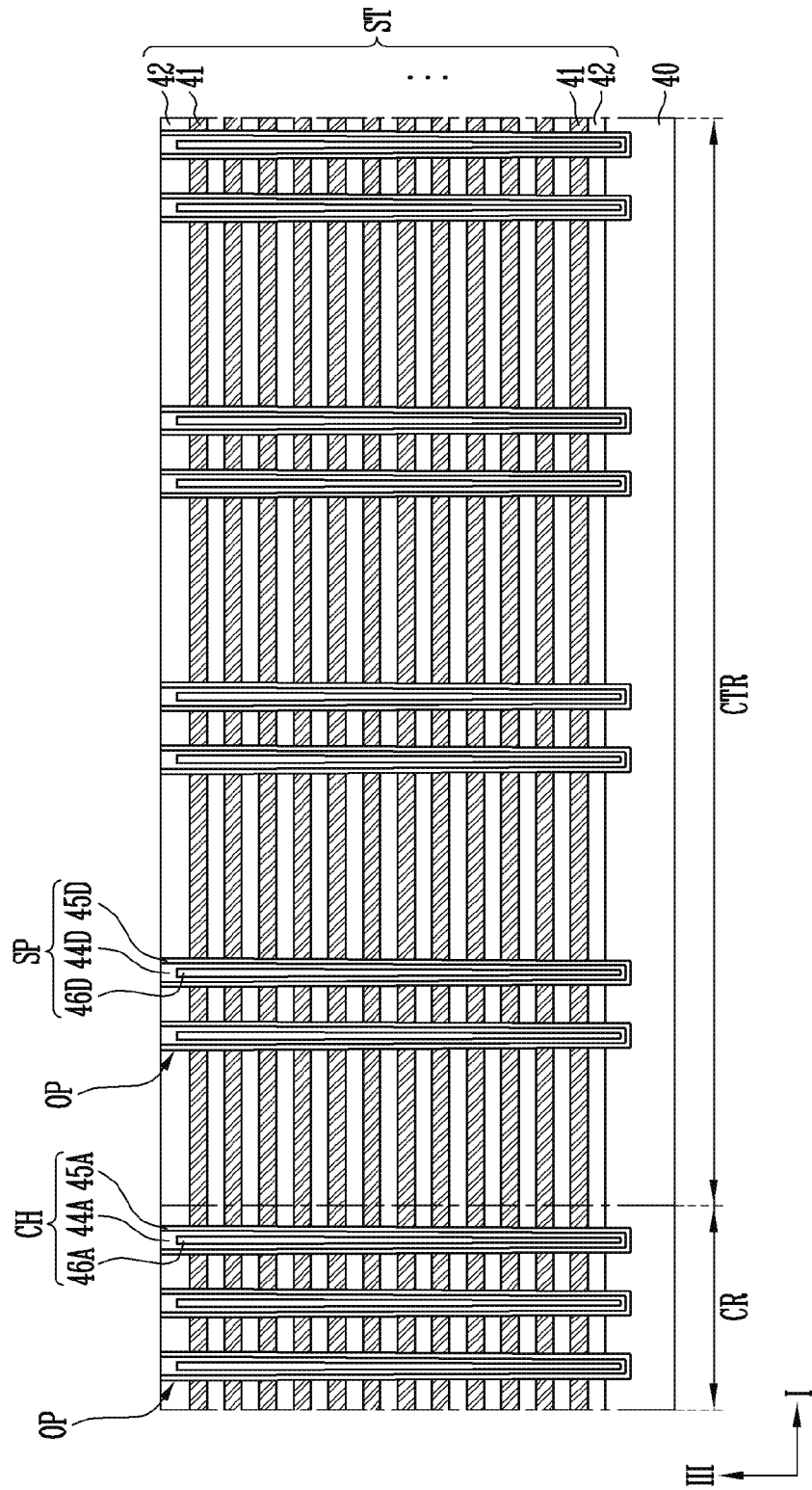

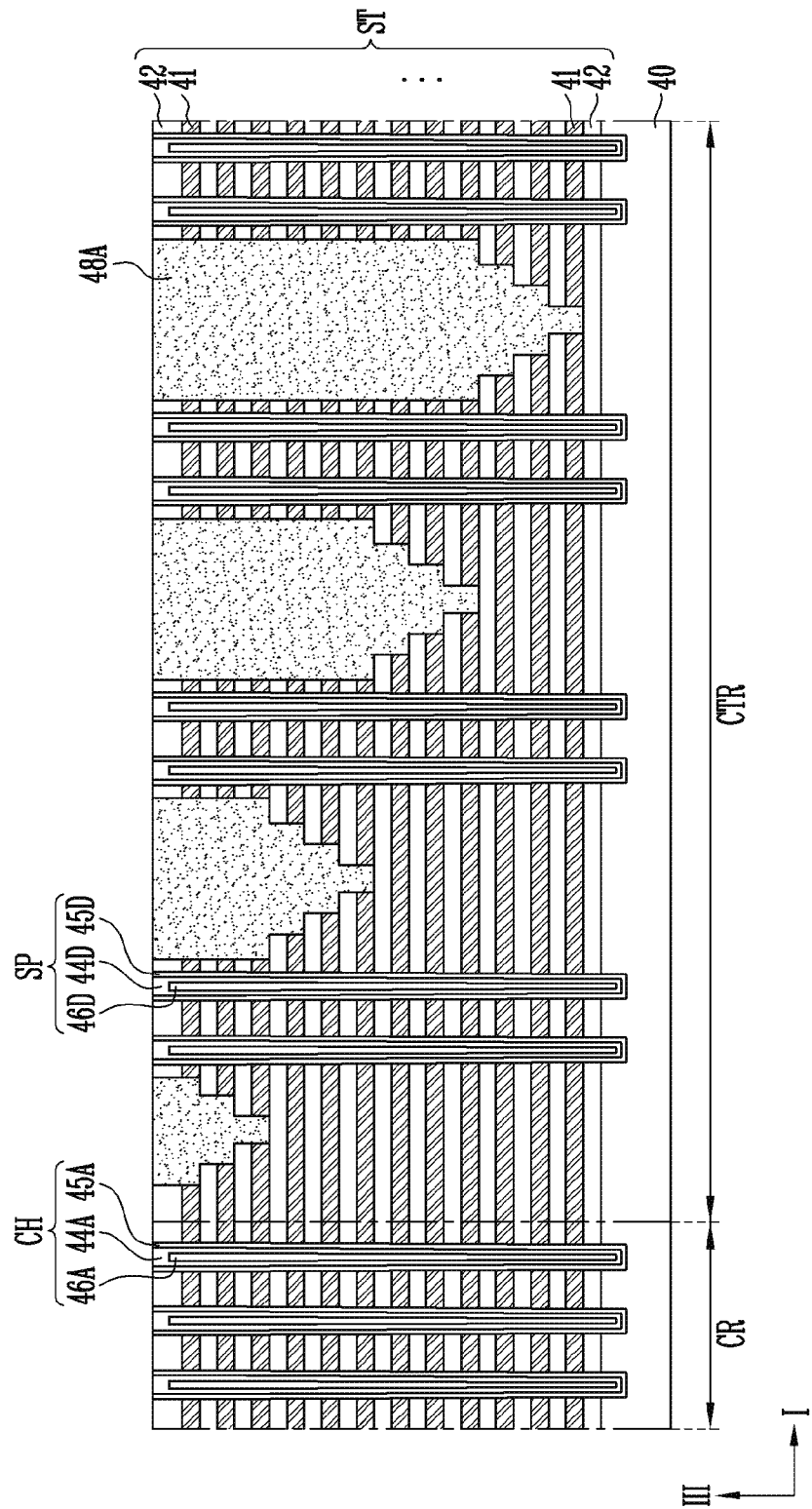

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2019-0118246 filed on Sep. 25, 2019, in the Korean Intellectual Property Office, the entire disclosure of which is incorporated herein by reference.

BACKGROUND

1. Technical Field

The present disclosure generally relates to an electronic device, and more particularly, to a semiconductor device and a manufacturing method of a semiconductor device.

2. Related Art

A nonvolatile memory device is a memory device in which stored data is maintained as it is even when the supply of power is interrupted. As the improvement of the degree of integration of two-dimensional nonvolatile memory devices with memory cells that are formed over a semiconductor substrate in the form of a single layer has reached the limit, there has been proposed a three-dimensional nonvolatile memory device in which memory cells are formed in a vertical direction over a semiconductor substrate.

The three-dimensional memory device includes interlayer insulating layers and gate electrodes, which are alternately stacked, and channel layers penetrating the interlayer insulating layers and the gate electrodes, and memory cells are stacked along the channel layers. Various structures and manufacturing methods have been developed to improve the operational reliability of the three-dimensional nonvolatile memory device.

SUMMARY

In accordance with an aspect of the present disclosure, there is provided a semiconductor device including: a stack structure including a cell region and a contact region; a channel structure penetrating the cell region of the stack structure; trenches penetrating the contact region of the stack structure to different depths; and a stop structure penetrating the contact region of the stack structure, the stop structure being located between the trenches.

In accordance with another aspect of the present disclosure, there is provided a semiconductor device including: a first sub-stack structure; a second sub-stack structure on the first sub-stack structure; a channel structure including a first sub-channel structure penetrating the first sub-stack structure and a second sub-channel structure penetrating the second sub-stack structure; trenches penetrating the second sub-stack structure to different depths; and a stop structure penetrating the second sub-stack structure, the stop structure being located between the trenches.

In accordance with still another aspect of the present disclosure, there is provided a method of manufacturing a semiconductor device, the method including: forming a stack structure including a cell region and a contact region; forming a channel structure penetrating the cell region of the stack structure; forming stop structures penetrating the contact region of the stack structure; forming trenches penetrating the contact region of the stack structure, the trenches being located between the stop structures; forming an insulating material on the stack structure including the trenches; and forming insulating patterns in the trenches by planarizing the insulating material, using the stop structures.

In accordance with still another aspect of the present disclosure, there is provided a method of manufacturing a semiconductor device, the method including: forming a first sub-stack structure; forming a first sub-channel structure penetrating the first sub-stack structure; forming a second sub-stack structure on the first sub-stack structure; forming a second sub-channel structure penetrating the second sub-stack structure; forming stop structures penetrating the second sub-stack structure, when the second sub-channel structures are formed; and forming trenches penetrating the second sub-stack structure to different depths, the trenches being located between the stop structures.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Embodiments may provide a semiconductor device having an easy manufacturing process, a stable structure, and improved characteristics, and a manufacturing method of a semiconductor device.

Figure 1B:
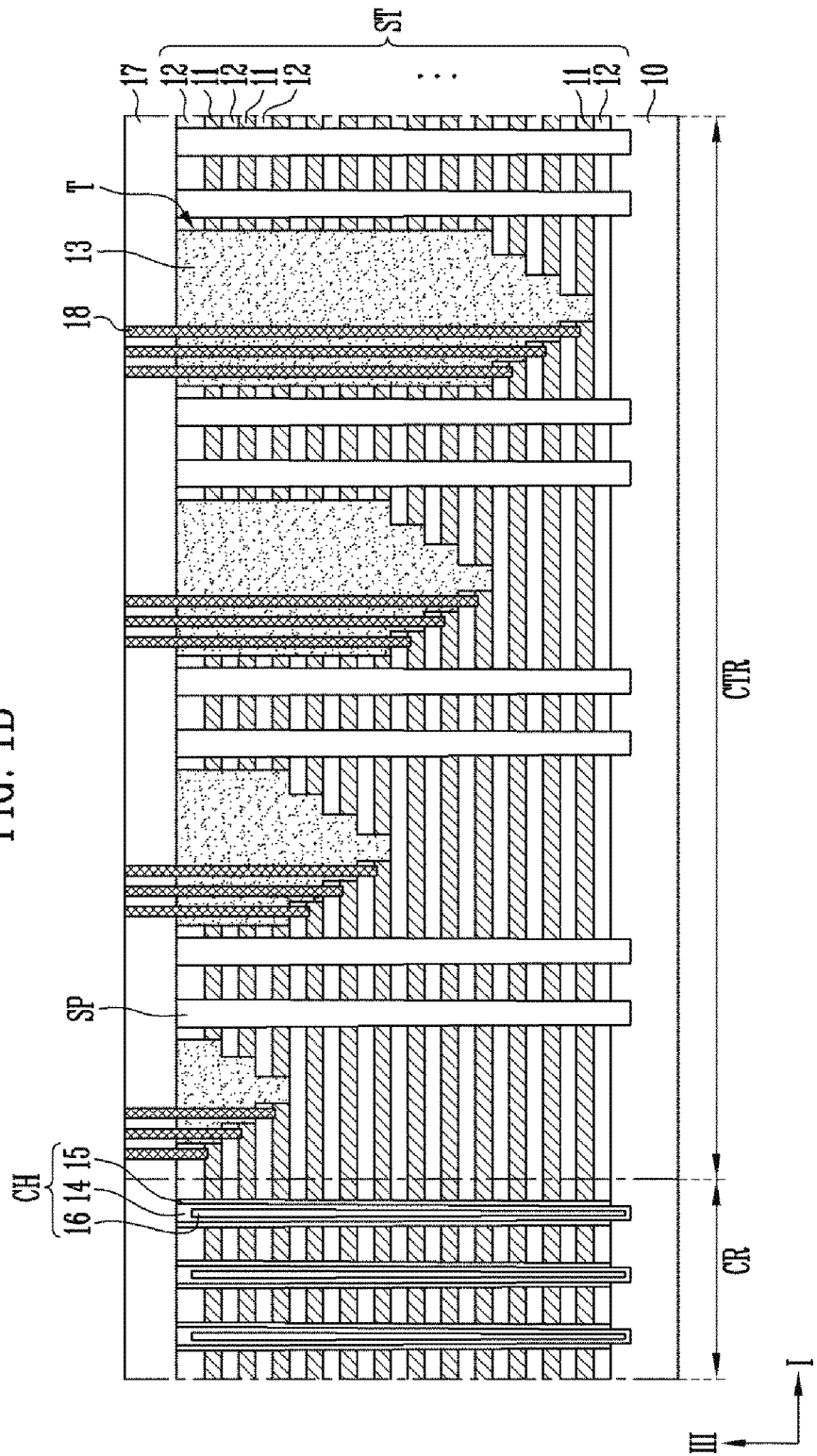

FIGS. 1A and 1B are views illustrating a structure of a semiconductor device in accordance with an embodiment of the present disclosure.

Figure 2B:
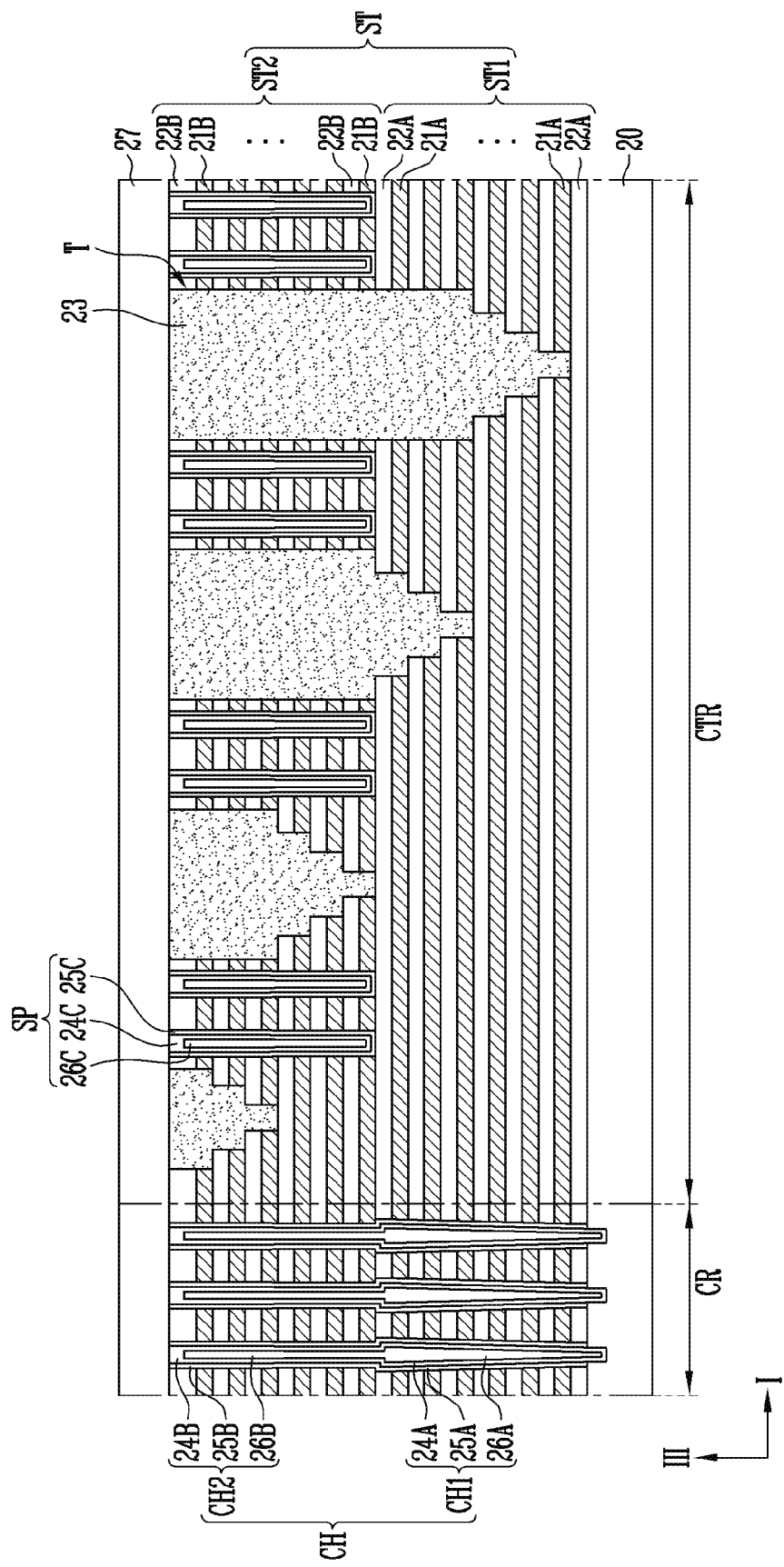

FIGS. 2A and 2B are views illustrating a structure of a semiconductor device in accordance with an embodiment of the present disclosure.

FIGS. 3A, 3B, 3C, 3D, and 3E are views illustrating a structure of a semiconductor device in accordance with an embodiment of the present disclosure.

FIGS. 4A, 4B, 4C, and 4D are sectional views illustrating a manufacturing method of a semiconductor device in accordance with an embodiment of the present disclosure.

FIGS. 5A, 5B, 5C, and 5D are sectional views illustrating a manufacturing method of a semiconductor device in accordance with an embodiment of the present disclosure.

Figure 6:
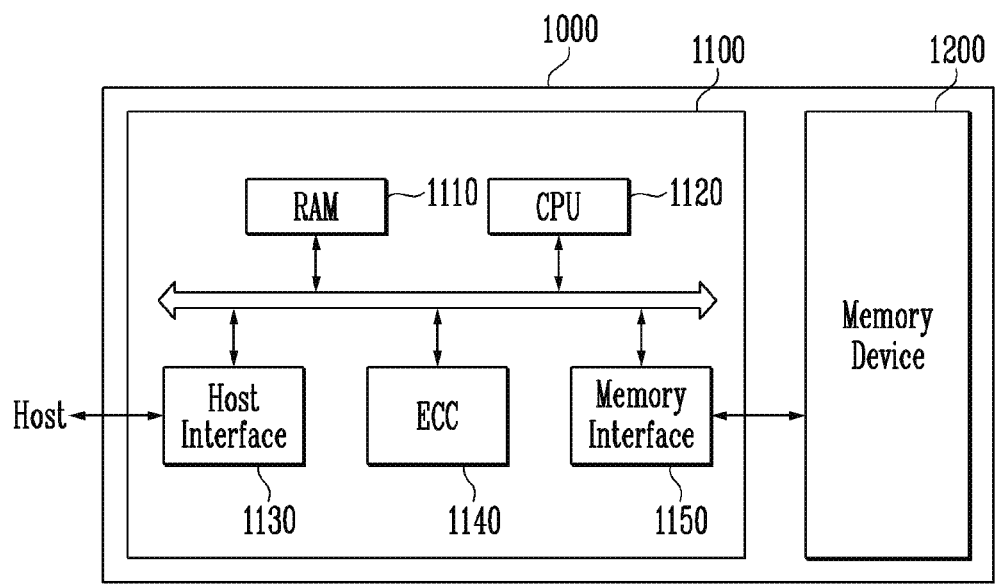

FIG. 6 is a block diagram illustrating a configuration of a memory system in accordance with an embodiment of the present disclosure.

Figure 7:
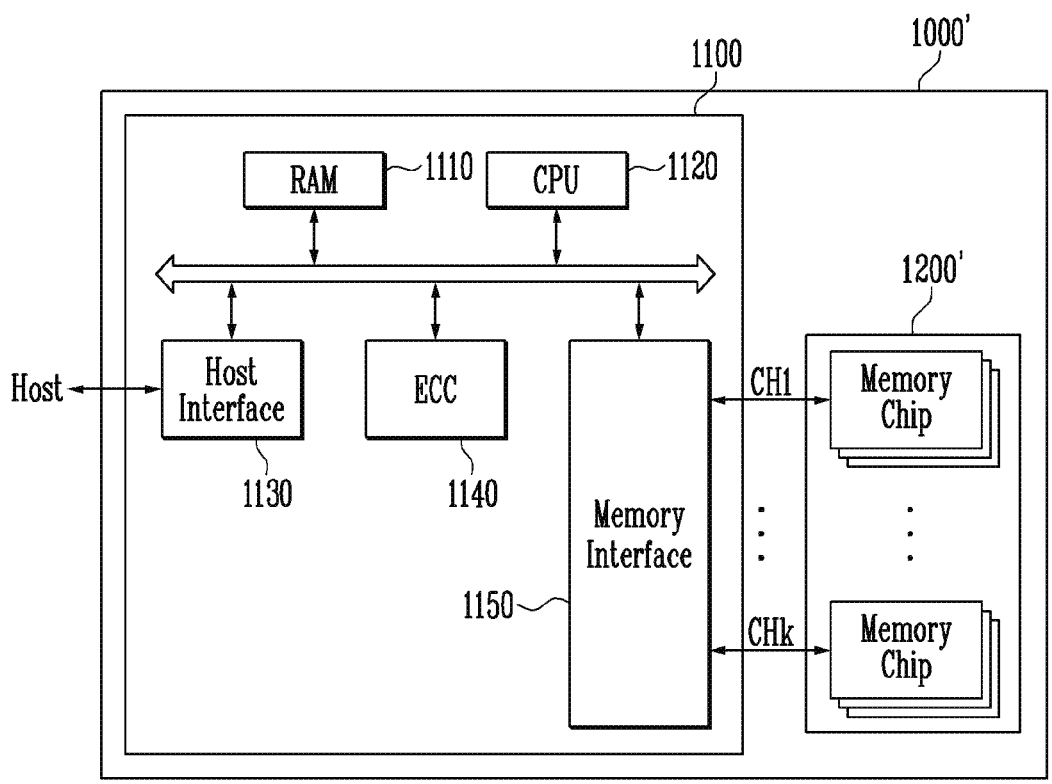

FIG. 7 is a block diagram illustrating a configuration of a memory system in accordance with an embodiment of the present disclosure.

Figure 8:
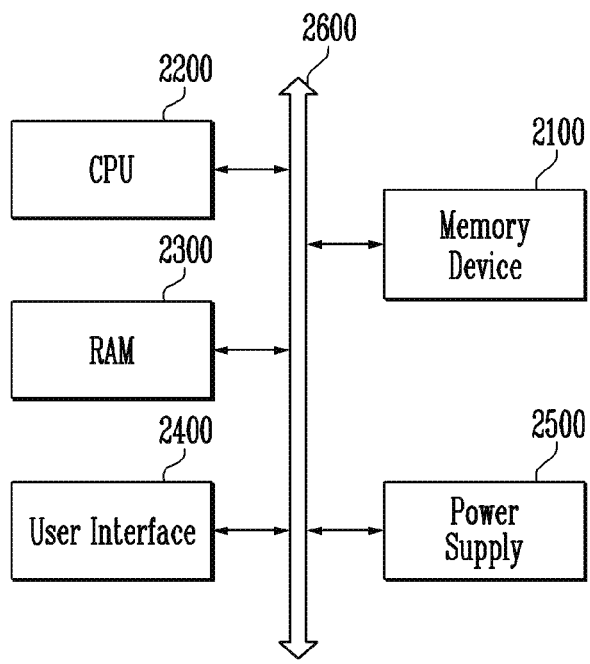

FIG. 8 is a block diagram illustrating a configuration of a computing system in accordance with an embodiment of the present disclosure.

Figure 9:
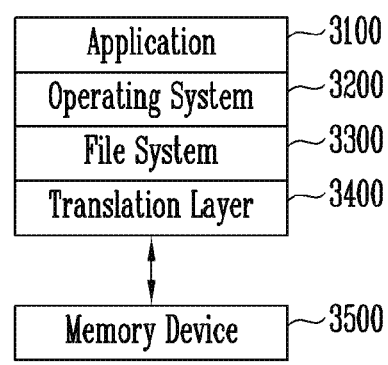

FIG. 9 is a block diagram illustrating a configuration of a computing system in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

FIGS. 1A and 1B are views illustrating a structure of a semiconductor device in accordance with an embodiment of the present disclosure. FIG. 1A is a layout, and FIG. 1B is a sectional view in a first direction I shown in FIG. 1A.

Referring to FIGS. 1A and 1B, the semiconductor memory device in accordance with an embodiment of the present disclosure may include a stack structure ST, channel structures CH, and stop structures SP. Also, the semiconductor device may further include a base 10, insulating patterns 13, an interlayer insulating layer 17, and contact plugs 18.

The stack structure ST may be located on the base 10. The base 10 may be a semiconductor substrate, and include a lower structure including a peripheral circuit, a source structure, and the like.

The stack structure ST may include conductive layers 11 and insulating layers 12, which are alternately stacked. The conductive layers 11 may be gate electrodes of a select transistor, a memory cell, and the like, and include polysilicon, tungsten, metal, and the like. The insulating layers 12 are used to insulate the stacked gate electrodes from each other, and may include an insulating material such as oxide or nitride.

The stack structure ST may include at least one cell region CR and at least one contact region CTR. The cell region CR may be a region in which memory strings are located. Each of the memory strings may include stacked memory cells. The contact region CTR may be a region in which an interconnection structure connected to the memory strings is located. The interconnection structure may include a contact plug, a line, and the like.

The cell region CR and the contact region CTR may be adjacent to each other in the first direction I. A cell region CR may be located between contact regions CTR. Alternatively, a contact region CTR may be located between cell regions CR.

The channel structures CH may penetrate the cell region CR of the stack structure ST. The channel structures CH may be arranged in the first direction I and a second direction II. Also, the channel structures CH may penetrate the stack structure ST in a third direction III. The third direction III may be a direction orthogonal to a plane defined in the first direction I and the second direction II.

Each of the channel structures CH may include a channel layer 14, a memory layer 15, and gap fill layer 16. The channel layer 14 may penetrate the stack structure ST in the third direction III. The channel layer 14 may extend to the base 10, and be electrically connected to the source structure included in the base 10. The memory layer 15 may surround a sidewall of the channel layer 14, or be interposed between the channel layer 14 and the conductive layers 11. The memory layer 15 may include at least one of a tunnel insulating layer, a data storage layer, and a charge blocking layer. The data storage layer may include a floating gate, a charge trap material, polysilicon, a nitride, a variable resistance material, a phase change material, and the like. The gap fill layer 16 may be formed in the channel layer 14. The gap fill layer 16 may include an insulating material such as oxide.

The stack structure ST may include trenches T located in the contact region CTR. The trenches T may have different depths. Each of the trenches T is used to expose the conductive layers 11, and may have an inner wall having a step shape. Each of the trenches T may include inner walls facing each other in the first direction I, and the inner walls may have step shapes that are symmetrical to each other or have step shapes that are asymmetrical to each other. In addition, at least one conductive layer 11 and at least one insulating layer 12 may constitute one layer of the step shape. The conductive layer 11 or the insulating layer 12 may be located at an uppermost portion of each layer.

The insulating patterns 13 may be respectively formed in the trenches T. Upper surfaces of the insulating patterns 13 and an upper surface of the stack structure ST may be located at substantially the same level. The upper surfaces of the insulating patterns 13 may be located on the same plane as the upper surface of the stack structure ST.

The contact region CTR may include dummy regions DR1 to DR4 located between the trenches T. The dummy regions DR1 to DR4 may substantially have the same height. Therefore, the contact region CTR of the stack structure ST may have a uniform height between the trenches T. In addition, upper surfaces of the dummy regions DR1 to DR4 and an upper surface of the cell region CR may have substantially the same level.

The dummy regions DR1 to DR4 may substantially have the same width (W1=W2=W3=W4) in the first direction DR1. Alternatively, at least one dummy region may have a width different from those of the other regions. The dummy region DR4 spaced apart from the cell region CR may have a width narrower than the dummy region DR1 adjacent to the cell region CR (W4<W1) or have a width wider than the dummy region DR1 adjacent to the cell region CR (W4>W1).

The stop structures SP may be located between the trenches T. The stop structures SP may be located to be spaced apart from the trenches T. Therefore, the stop structures SP may not penetrate the insulating patterns 13 filled in the trenches T. The stop structures SP may be arranged in the first direction I and the second direction II intersecting the first direction I. The stop structures SP may penetrate the dummy regions DR1 to DR4 of the stack structure ST in the third direction III. At least one stop structure SP may be located in one of the dummy regions DR1 to DR4. The number or arrangement of the stop structures SP may be changed depending on an area of the dummy regions DR1 to DR4.

Upper surfaces of the stop structures SP and the upper surface of the stack structure ST may be located at substantially the same level. The upper surfaces of the stop structure SP may be located on the same plane as the upper surface of the stack structure ST. The upper surfaces of the stop structures SP and the upper surfaces of the insulating patterns 13 may be located at substantially the same level. The upper surfaces of the stop structure SP may be located on the same plane as the upper surfaces of the insulating patterns 13.

Also, the upper surfaces of the stop structures SP and upper surfaces of the channel structures CH may be located at substantially the same level. The upper surfaces of the stop structures SP may be located on the same plane as the upper surfaces of the channel structures CH. The stop structures SP may have a height substantially the same or different from that of the channel structures CH. For example, the stop structures SP may have a height lower than that of the channel structures CH. Lower surfaces of the stop structures SP and lower surfaces of the channel structures CH may be located at different levels. The lower surfaces of the stop structures SP may be located at a level higher than that of the lower surfaces of the channel structures CH.

The interlayer insulating layer 17 may be located on the stack structure ST and the insulating patterns 13. The contact plugs 18 may penetrate the interlayer insulating layer 17 and the insulating patterns 13, and be respectively connected to the conductive layers 11.

Meanwhile, although a case where the stack structure ST includes four trenches T is described in these embodiments, the present disclosure is not limited thereto. The number, shape, arrangement, etc. of the trenches may be changed depending on a number of the conductive layers 11 included in the stack structure ST. Accordingly, the numbers, shapes, arrangements, etc. of the insulating patterns 13, the contact plugs 18, the stop structures SP, and the like may be changed.

FIGS. 2A and 2B are views illustrating a structure of a semiconductor device in accordance with an embodiment of the present disclosure. FIGS. 2A and 2B may be sectional views in the first direction I shown in FIG. 1A. Hereinafter, descriptions of contents overlapping with those described above will be omitted.

Referring to FIG. 2A, the semiconductor memory device in accordance with an embodiment of the present disclosure may include a base 20, a stack structure ST, channel structures CH, stop structures SP, insulating patterns 23, and an interlayer insulating layer 27.

The stop structures SP may have a structure substantially the same or similar to that of the channel structures CH, and include a material substantially the same or similar to that of the channel structures CH. The stop structures SP may be formed together with the channel structures CH when the channel structures CH are formed.

Each of the channel structures CH may include a memory layer 25 and a gap fill layer 26. Each of the stop structures SP may include a dummy channel layer 24D penetrating the stack structure ST, a dummy memory layer 25D surrounding a sidewall of the dummy channel layer 24D, and a dummy gap fill layer 26D in the dummy channel layer 24D. The dummy channel layer 24D may correspond to the channel layer 24, the dummy memory layer 25D may correspond to the memory layer 25, and the dummy gap fill layer 26D may correspond to the gap fill layer 26.

Referring to FIG. 2B, the stack structure ST may include a sub-stack structures ST1 and ST2. A first sub-stack structure ST1 may include first conductive layers 21A and first insulating layers 22A, which are alternately stacked. A second sub-stack structure ST2 may include second conductive layer 21B and second insulating layers 22B, which are alternately stacked.

Each of the channel structures CH may include sub-channel structures CH1 and CH2. First sub-channel structures CH1 may penetrate the first sub-stack structure ST1, and second sub-channel structures CH2 may penetrate the second sub-stack structure ST2.

Each of the first sub-channel structures CH1 may include a first channel layer 24A, a first memory layer 25A, and a first gap fill layer 26A. Each of the second sub-channel structures CH2 may include a second channel layer 24B, a second memory layer 25B, and a second gap fill layer 26B.

In an embodiment, the second sub-stack structure ST2 and the second sub-channel structures CH2 may be formed after the first sub-stack structure ST1 and the first sub-channel structures CH1 are formed. A first channel layer 24A and a second channel layer 24B, which are included in one channel structure CH, may be layers formed through separate processes, and an interface may exist between the first channel layer 24A and the second channel layer 24B. A first memory layer 25A and a second memory layer 25B, which are included in one channel structure CH, may be layers formed through separate processes, and an interface may exist between the first memory layer 25A and the second memory layer 25B. A first gap fill layer 26A and a second gap fill layer 26B, which are included in one channel structure CH, may be layers formed through separate processes, and an interface may exist between the first gap fill layer 26A and the second gap fill layer 26B.

In an embodiment, the first sub-channel structures CH1 and the second sub-channel structures CH2 may be formed after the first sub-stack structure ST1 and the second sub-stack structure ST2 are formed. A first channel layer 24A and a second channel layer 24B, which are included in one channel structure CH, may be layers formed through the same process, and constitute a single layer. A first memory layer 25A and a second memory layer 25B, which are included in one channel structure CH, may be layers formed through the same process, and constitute a single layer. A first gap fill layer 26A and a second gap fill layer 26B, which are included in one channel structure CH, may be formed through the same process, and constitute a single layer.

The stop structures SP may penetrate the stack structure ST to a partial depth. The stop structures SP may have a height corresponding to at least one of the sub-stack structures ST1 and ST2 included in the stack structure ST. For example, the stop structures SP may have a height corresponding to a sub-stack structure located at an uppermost portion among the sub-stack structures ST1 and ST2. Alternatively, the stop structures SP may correspond to at least one of the sub-channel structures CH1 and CH2 included in the channel structure CH. For example, the stop structures SP may correspond to a sub-channel structure located at an uppermost portion among the sub-channel structures CH1 and CH2.

The stop structures SP may have a height corresponding to the second sub-stack structure ST2. Alternatively, the stop structures SP may have a structure corresponding to the second sub-channel structures CH2. The stop structures SP may have a structure substantially the same or similar to the second sub-channel structures CH2, and include a material substantially the same or similar to that of the second sub-channel structures CH2. The stop structures SP may have a height corresponding to the second sub-channel structures CH2. The stop structures SP may be formed together with the second sub-channel structures CH2 when the second sub-channel structures CH2 are formed.

Each of the stop structures SP may include a dummy channel layer 24C, a dummy memory layer 25C, and a dummy gap fill layer 26C. The dummy channel layer 24C may correspond to the second channel layer 24B, the dummy memory layer 25C may correspond to the second memory layer 25B, and the dummy gap fill layer 26C may correspond to the second gap fill layer 26B.

Meanwhile, although a case where the stack structure ST includes two sub-stack structures ST1 and ST2 and the channel structure CH includes two sub-channel structures CH1 and CH2 is described in these embodiments, the present disclosure is not limited thereto. The number of the sub-stack structures included in the stack structure ST and the number of the sub-channel structures included in the channel structure CH may be variously changed. In addition, the depth of the stop structures SP partially penetrating the stack structure ST may also be variously changed.

FIGS. 3A to 3E are views illustrating a structure of a semiconductor device in accordance with an embodiment of the present disclosure, which are sectional views illustrating various forms of a stop structure. Hereinafter, descriptions of contents overlapping with those described above will be omitted.

Referring to FIGS. 3A to 3E, the semiconductor memory device in accordance with an embodiment of the present disclosure may include a base 30, a stack structure ST, and one or more stop structures SP1 to SP5. The stack structure ST may include conductive layers 31 and insulating layers 32, which are alternately stacked.

Figure 3A:
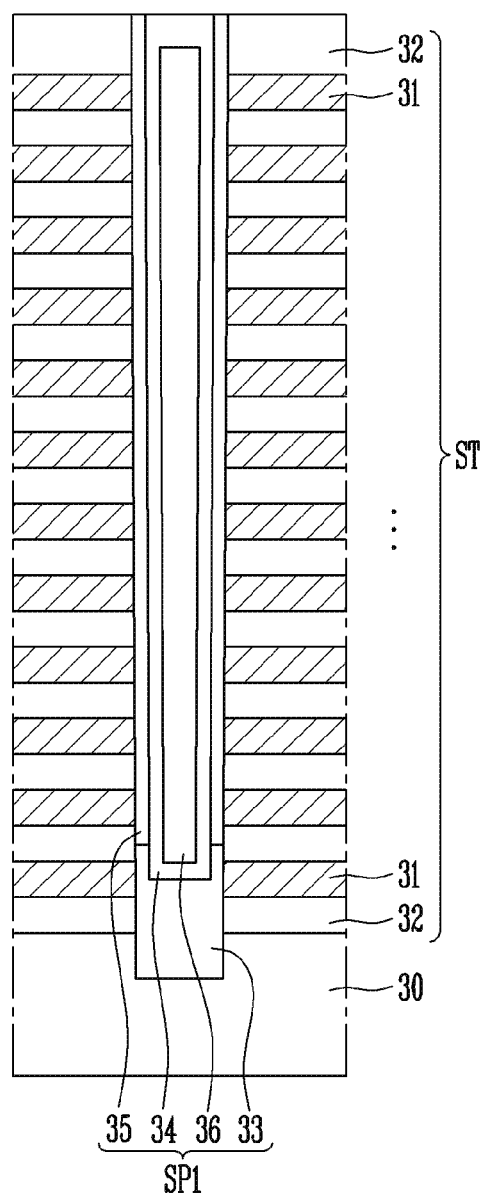

Referring to FIG. 3A, a first stop structure SP1 may include a semiconductor pattern 33, a dummy channel layer 34, a dummy memory layer 35, and a dummy gap fill layer 36. The dummy channel layer 34 may penetrate the stack structure ST, and be connected to the base 30 through the semiconductor pattern 33. The semiconductor pattern 33 may include a semiconductor material such as polysilicon or single crystalline silicon. The semiconductor pattern 33 may be grown from the base 30 by using a selective growth process. The dummy memory layer 35 may be formed to surround a sidewall of the dummy channel layer 34. The dummy gap fill layer 36 may be formed in the dummy channel layer 34. The channel structure CH located in the cell region CR may have a structure substantially the same or similar to that of the first stop structure SP1.

Figure 3B:
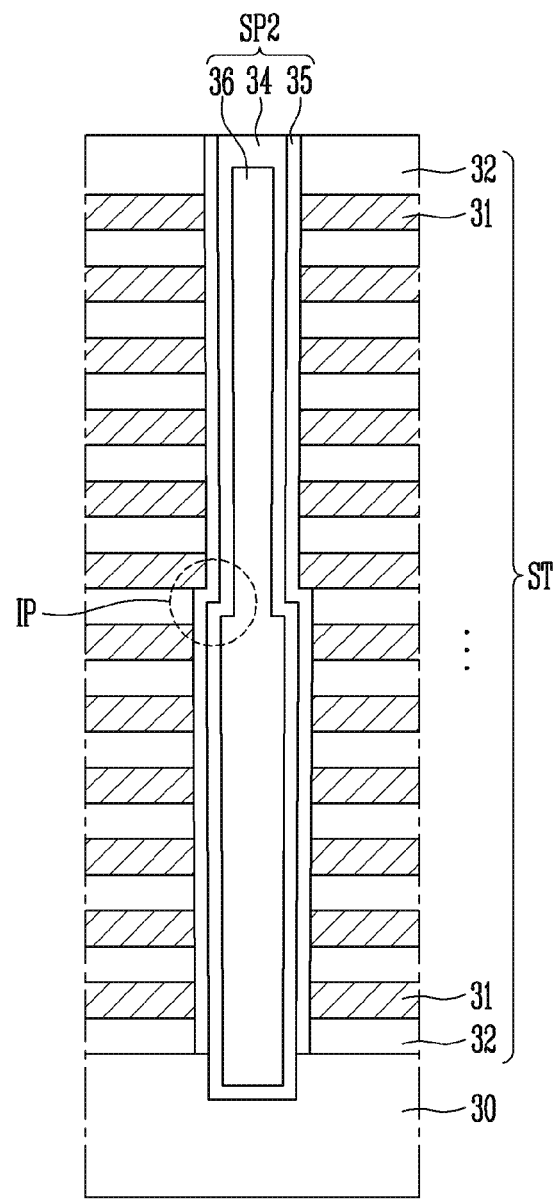

Referring to FIG. 3B, a second stop structure SP2 may include a dummy channel layer 34, a dummy memory layer 35, and a dummy gap fill layer 36. Each of the dummy channel layer 34, the dummy memory layer 35, and the dummy gap fill layer 36 may include at least one inflection point IP at a sidewall of the dummy channel layer 34, the dummy memory layer 35, and the dummy gap fill layer 36. The inflection point IP may be a point at which the slope of the sidewall is changed. The channel structure CH located in the cell region CR may have a structure substantially the same or similar to that of the second stop structure SP2.

Referring to FIG. 3C, a third stop structure SP3 may include a dummy channel layer 34, a dummy memory layer 35C, and a dummy gap fill layer 36. The dummy memory layer 35D may be formed to surround a sidewall and a bottom surface of the dummy channel layer 34. The dummy memory layer 35C may be interposed between the dummy channel layer 34 and the base 30, and electrically separate the dummy channel layer 34 and the base 30 from each other. The dummy channel layer 34 may have an electrically floated state.

Figure 3D:
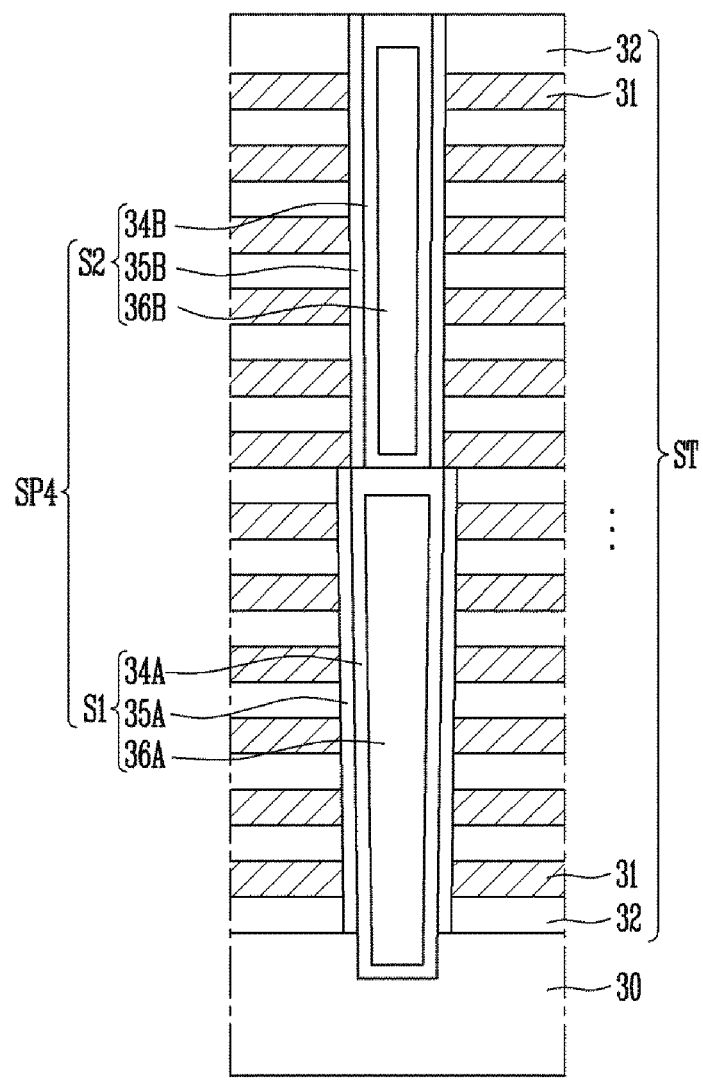

Referring to FIG. 3D, a fourth stop structure SP4 may include sub-structures S1 and S2. A first sub-structure S1 may include a first dummy channel layer 34A, a first dummy memory layer 35A, and a first dummy gap fill layer 36A. A second sub structure S2 may include a second dummy channel layer 34B, a second dummy memory layer 35B, and a second dummy gap fill layer 36B. The second dummy channel layer 34B may be connected to the first dummy channel layer 34A.

The first dummy memory layer 35A may be formed to surround a sidewall of the first dummy channel layer 34A, and the first dummy channel layer 34A may be connected to the base 30. The channel structure CH located in the cell region CR may have a structure substantially the same or similar to that of the fourth stop structure SP4. Similarly to FIG. 3C, the first dummy memory layer 35A may be formed to surround a sidewall and a bottom surface of the first dummy channel layer 34A.

Figure 3E:
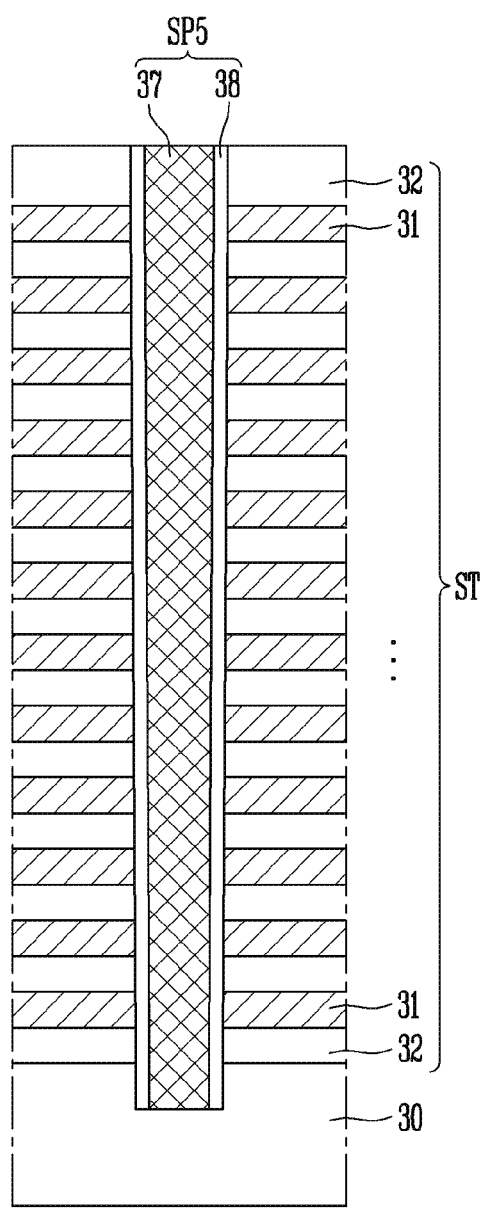

Referring to FIG. 3E, a fifth stop structure SP5 may include a contact plug 37 and an insulating spacer 38. The contact plug 37 may partially or completely penetrate the stack structure ST, and extend down to the base 30. The contact plug 37 may be connected to a peripheral circuit, an interconnection structure, and the like, which are included in the base 30. The contact plug 37 may include a conductive material such as polysilicon, tungsten or metal. The insulating spacer 38 may be formed to surround a sidewall of the contact plug 37. The insulating spacer 38 may include oxide, nitride, etc.

The semiconductor device may additionally include a contact plug located in the cell region CR or the contact region CTR. In addition, the contact plug additionally included in the semiconductor device may have a structure substantially the same or similar to that of the fifth stop structure SP5. Meanwhile, the first to fifth stop structures SP1 to SP5 may partially pass through the stack structure ST. The first to fifth stop structures SP1 to SP5 may pass through the second sub-stack structure ST2 as shown in FIG. 2B.

FIGS. 4A to 4D are sectional views illustrating a manufacturing method of a semiconductor device in accordance with an embodiment of the present disclosure. Hereinafter, descriptions of contents overlapping with those described above will be omitted.

Referring to FIG. 4A, a stack structure ST is formed on a base 40. The stack structure ST may include first material layers 41 and second material layers 42, which are alternately stacked. The first material layers 41 may be used to form gate electrodes of a memory cell, a select transistor, and the like, and the second material layers 42 may be used to insulate the stacked gate electrodes from each other. The first material layers 41 are formed of a material having a higher etch selectivity with respect to the second material layers 42. In an example, the first material layers 41 may be sacrificial layers including nitride, etc., and the second material layers 42 may be insulating layers including oxide, etc. In another example, the first material layers 41 may be conductive layers including polysilicon, tungsten, etc., and the second material layers 42 may be insulating layers including oxide, etc.

Subsequently, channel structures CH are formed. The channel structures CH may penetrate a cell region CR of the stack structure ST, and extend down to the base 40. Each of the channel structures CH may include a channel layer 44A, a memory layer 45A, and a gap fill layer 46A.

In addition, stop structures SP are formed. The stop structures SP may penetrate a contact region CTR of the stack structure ST, and extend down to the base 40. The stop structures SP may be substantially arranged at the same distance or at different distances. For example, the stop structures SP may be disposed to be spaced apart from each other for each group.

The stop structures SP is used to stop polishing in a subsequent planarization process. Therefore, the stop structures SP may include a material having a higher etch selectivity with respect to the stack structure ST. The stop structures SP may include a semiconductor material such as silicon, germanium or polysilicon, or include a metal such as tungsten.

The time at which the stop structures SP are formed may be adjusted according to a structure, material, etc. of the stop structures SP. The stop structures SP may be formed before the channel structures CH are formed, be formed when the channel structures CH are formed, or be formed after the channel structures CH are formed.

When the stop structures SP have a structure substantially the same or similar to that of the channel structures CH, the stop structures SP may be formed when the channel structures CH are formed. Each of the stop structures SP may include a dummy channel layer 44D, a dummy memory layer 45D, and a dummy gap fill layer 46D.

A method of forming the channel structures CH and the stop structures SP will be described as follows. First, openings OP penetrating the stack structure ST are formed. The openings OP may be located in the cell region CR and the contact region CTR. Subsequently, memory layers 45A and dummy memory layers 45D are formed in the openings OP Each of the memory layers 45A and the dummy memory layers 45D may include at least one of a charge blocking layer, a data storage layer, and a tunnel insulating layer. Subsequently, channel layers 44A and dummy channel layers 44D are formed in the openings OP. The channel layers 44A may include gap fill layers 46A, and the dummy channel layers 44D may include dummy gap fill layers 46D. The memory layers 45A may be formed to surround sidewalls of the channel layer 44A or be formed to surround the sidewalls and bottom surfaces of the channel layers 44A. The dummy memory layers 45D may be formed to surround sidewalls of the dummy channel layers 44D or be formed to surround the sidewalls and bottom surfaces of the dummy channel layers 44D.

Figure 4B:
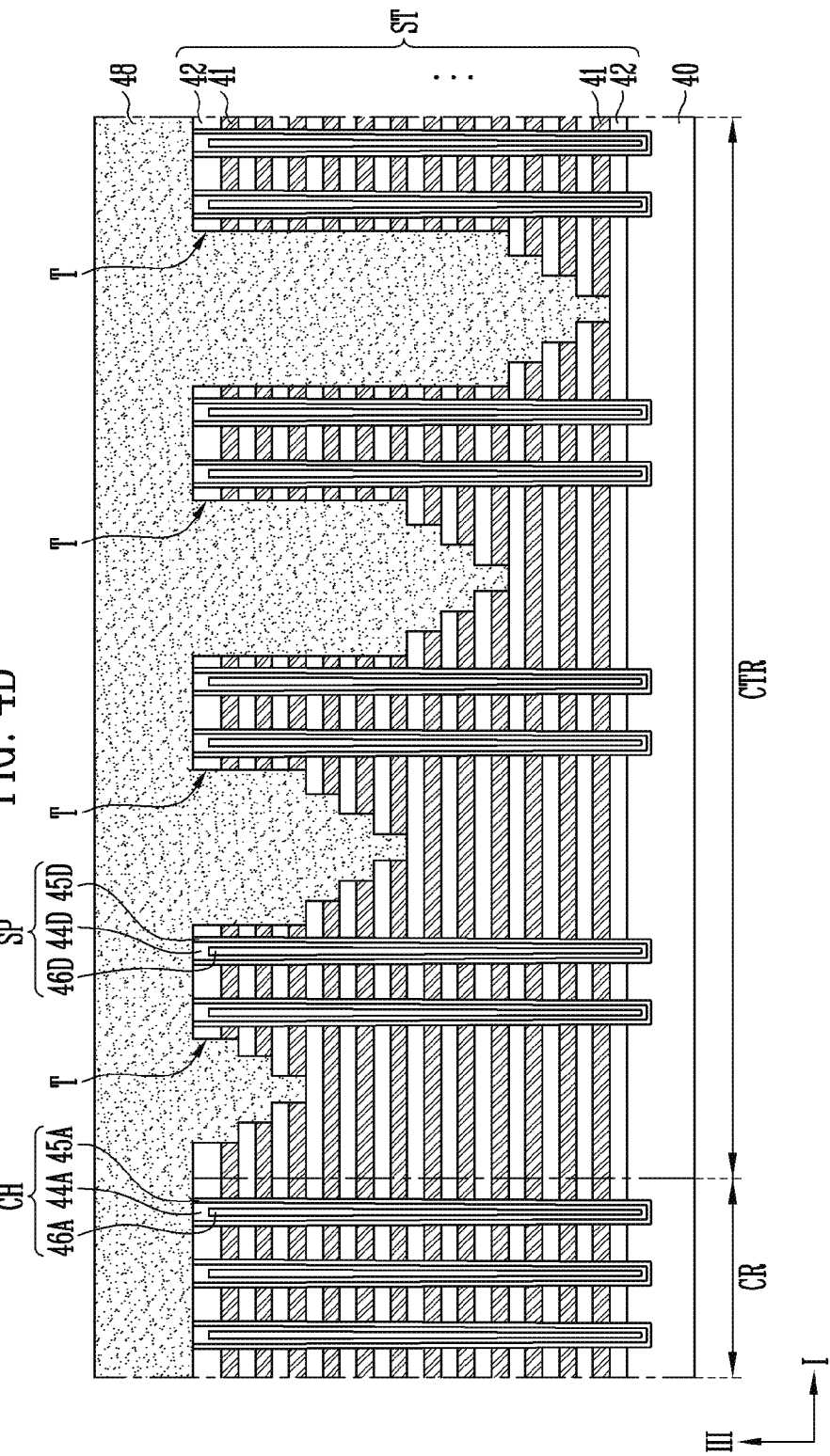

Referring to FIG. 4B, trenches T having different depths are formed. The trenches T may be located between the stop structures SP. A trench T spaced apart from the cell region CR may have a depth deeper than that of a trench T adjacent to the cell region CR, or a trench T spaced apart from the cell region CR may have a depth shallower than that of a trench T adjacent to the cell region CR. Alternatively, the trenches T may be formed to have different depths, regardless of distances of the trenches T from the cell region CR.

Each of the trenches T may have a sidewall having a step shape. Each of the trenches T may have a step shape at the entire sidewall or have a step shape at only a portion of the sidewall. A plurality of stop structures SP may be located between adjacent trenches T, and constitute one group. Numbers of the stop structures SP included in the respective groups may be equal to or different from each other.

Subsequently, an insulating material 48 is formed on the stack structure ST including the trenches T. The insulating material 48 may be formed to fill the trenches T. Also, the insulating material 48 may be formed to cover the cell region CR and the contact region CTR of the stack structure ST. The insulating material 48 may include a material having a higher etch selectivity with respect to the stop structures SP. The insulating material 48 may include oxide, nitride, etc.

Referring to FIG. 4C, insulating patterns 48A are formed by planarizing the insulating material 48. The planarization process may use a Chemical Mechanical Polishing (CMP) process. The insulating patterns 48A may be formed by polishing the insulating material 48 until upper surfaces of the stop structures SP are exposed. In the planarization process, the polishing may be stopped by using the stop structures SP or by using the stop structures SP and the channel structures CH.

Since the stop structures SP includes a material having a higher etch selectivity with respect to the stack structure ST, the insulating material 48 may be polished without damage of the stack structure ST in the planarization process. Therefore, upper surfaces of the insulating patterns 48A and the upper surfaces of the stop structures SP may be substantially located at the same level. In addition, the upper surfaces of the insulating patterns 48A and an upper surface of the stack structure ST may be substantially located at the same level.

Figure 4D:
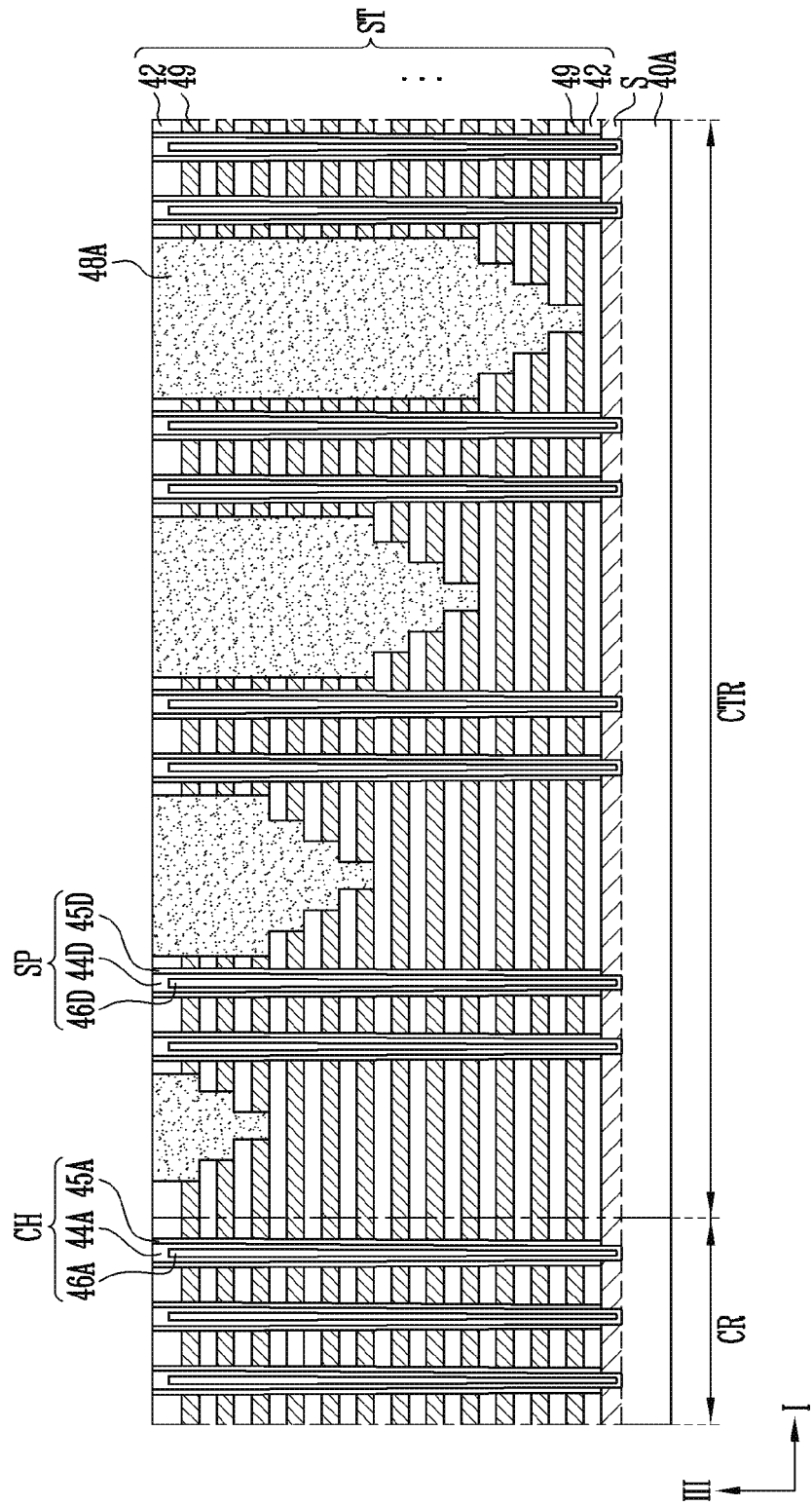

Referring to FIG. 4D, an additional process may be performed according to materials of the channel structures CH and the first material layers 41.

In an embodiment of the additional process, an opening exposing the memory layer 45A and the dummy memory layer 45D is formed by removing a sacrificial layer in a base 40A. Subsequently, the memory layer 45A and the dummy memory layer 45D, which are exposed through the opening, are removed, so that the channel layer 44A and the dummy channel layer 44D are exposed. Subsequently, a source layer S connected to the channel layer 44A and the dummy channel layer 44D is formed in the opening. Accordingly, the channel structures CH and the stop structures SP may be connected to the source layer S in the base 40A. The additional process may be performed on only the channel structures CH. The source layer S may be formed in only the cell region CR, and the stop structures SP may maintain the shape shown in FIG. 4C. Alternatively, the additional process may be performed on only some of the stop structures SP.

In an embodiment of the additional process, after a slit (not shown) penetrating the stack structure ST is formed, the first material layers 41 are replaced with third material layers 49. In an example, after openings are formed by selectively removing the first material layers 41 through the slit, the third material layers 49 are formed in the openings. The third material layers 49 may include a metal such as tungsten. In another example, the third material layers 49 may be formed by siliciding the first material layers 41.

According to the manufacturing method described above, the insulating material 48 is polished by using stop structures SP. Thus, damage of the stack structure ST or occurrence of dishing in the planarization process can be prevented.

Meanwhile, although a case where the stop structures SP have a structure similar to that of the channel structures CH is described in this embodiment, this is merely illustrative, and the present disclosure is not limited thereto. The stop structures SP may have the forms described with reference to FIGS. 1A to 3E or have a form obtained by combining the same.

FIGS. 5A to 5D are sectional views illustrating a manufacturing method of a semiconductor device in accordance with an embodiment of the present disclosure. Hereinafter, descriptions of contents overlapping with those described above will be omitted.

Figure 5A:
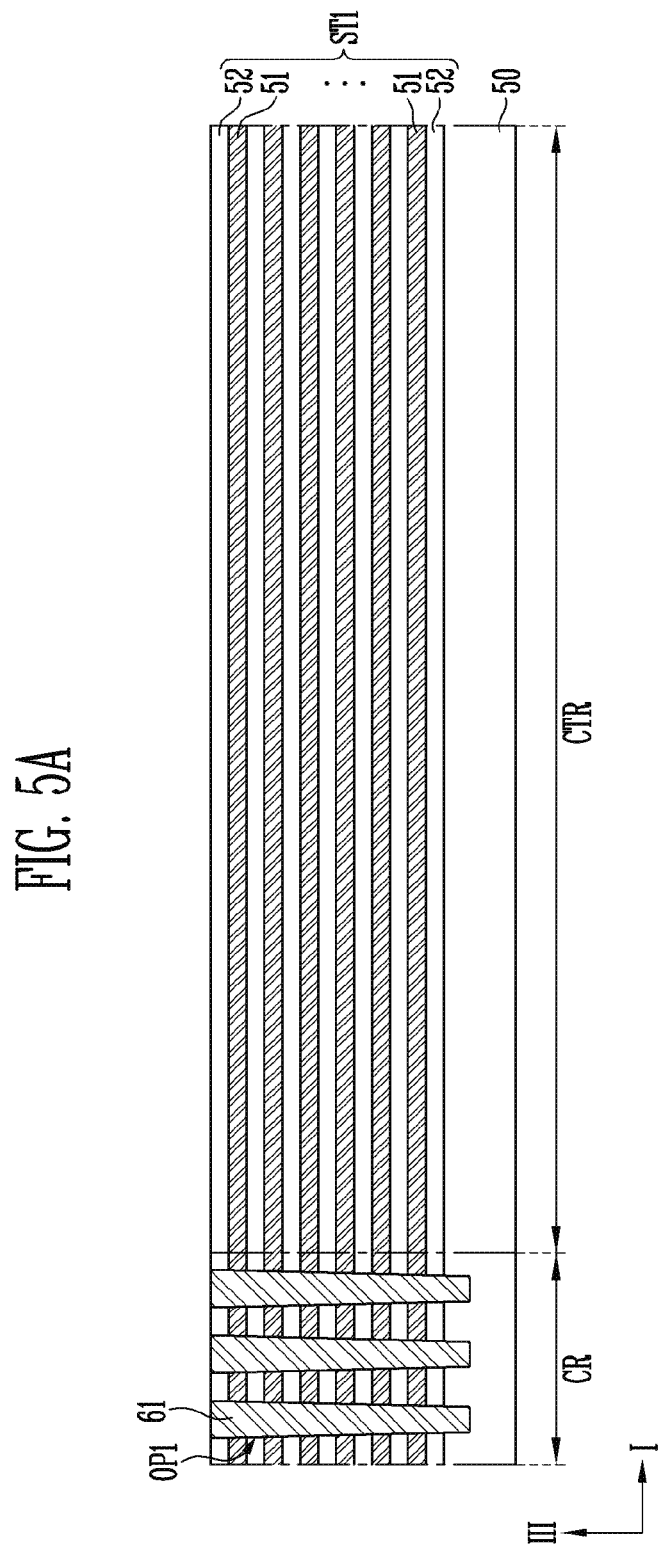

Referring to FIG. 5A, a first sub-stack structure ST1 is formed on a base 50. The first sub-stack structure ST1 may include first material layers 51 and second material layers 52, which are alternately stacked. The first material layers 51 may be used to form gate electrodes of a memory cell, a select transistor, and the like, and the second material layers 52 may be used to insulate the stacked gate electrodes from each other. The first material layers 51 are formed of a material having a higher etch selectivity with respect to the second material layers 52. In an example, the first material layers 51 may be sacrificial layers including nitride, etc., and the second material layers 52 may be insulating layers including oxide, etc. In another example, the first material layers 51 may be conductive layers including polysilicon, tungsten, etc., and the second material layers 52 may be insulating layers including oxide, etc.

Subsequently, sacrificial layers 61 penetrating the first sub-stack structure ST1 are formed. For example, after first openings OP1 penetrating the first sub-stack structure ST1 are formed, the sacrificial layers 61 are formed in the first openings OP1. The sacrificial layers 61 may include a material having a higher etch selectivity with respect to the first and second material layers 51 and 52. The sacrificial layers 61 may include tungsten. Instead of the sacrificial layers 61, a first sub-channel structure may be formed in advance.

Figure 5B:
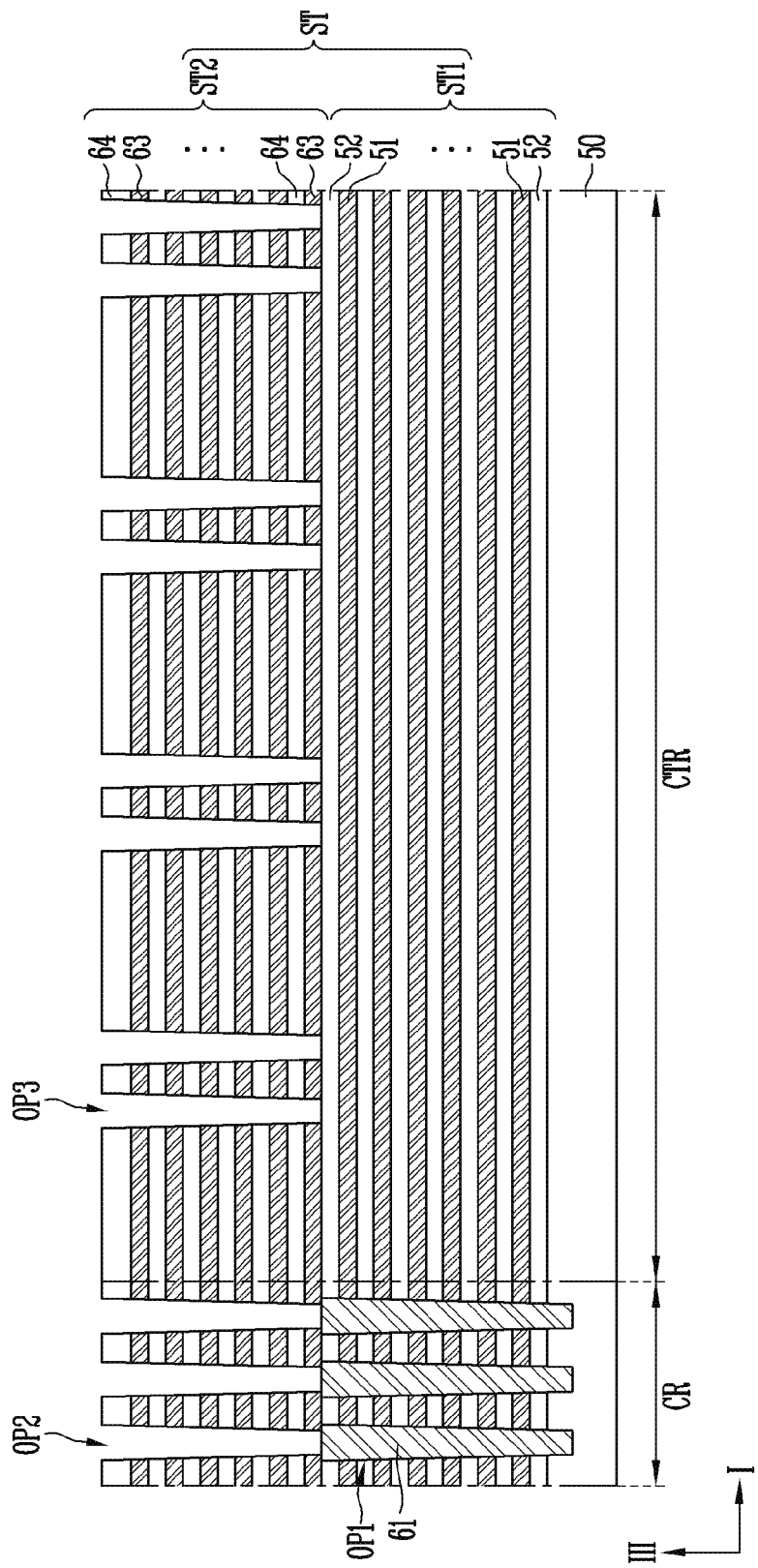

Referring to FIG. 5B, a second sub-stack structure ST2 is formed on the first sub-stack structure ST1. The second sub-stack structure ST2 may include third material layers 63 and fourth material layers 64, which are alternately stacked. The third material layers 63 may be used to form gate electrodes of a memory cell, a select transistor, and the like, and the fourth material layers 64 may be used to insulate the stacked gate electrodes from each other. The third material layers 63 are formed of a material having a higher etch selectivity with respect to the fourth material layers 64. In an example, the third material layers 63 may be sacrificial layers including nitride, etc., and the fourth material layers 64 may be insulating layers including oxide, etc. In another example, the third material layers 63 may be conductive layers including polysilicon, tungsten, etc., and the fourth material layers 64 may be insulating layers including oxide, etc. The third material layers 63 may include a material substantially the same or similar to that of the first material layers 51, and the fourth material layers 64 may include a material substantially the same or similar to that of the second material layers 52.

Subsequently, second openings OP2 penetrating the second sub-stack structure ST2 are formed. The second openings OP2 may be located in a cell region CR, and be located to respectively correspond to the first openings OP1. The second openings OP2 may be formed to a depth where the sacrificial layers 61 are exposed.

In addition, third openings OP3 penetrating the second sub-stack structure ST2 are formed. The third openings OP3 may be located in a contact region CTR. The third openings OP3 may be formed when the second openings OP2 are formed. The third openings OP3 and the second openings OP2 may have substantially the same depth. The third openings OP3 may have a depth where the first sub-stack structure ST1 is exposed.

Figure 5C:
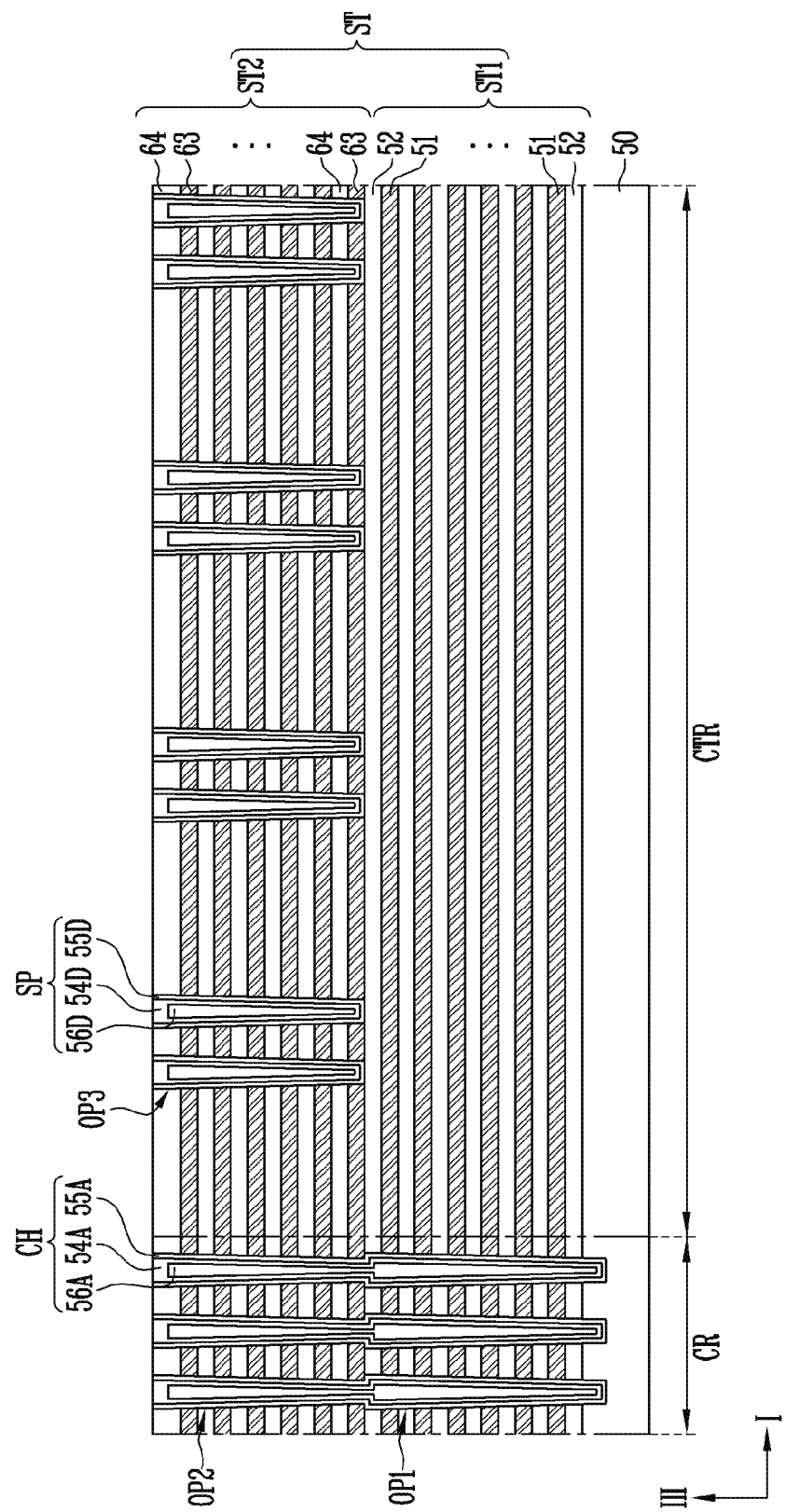

Referring to FIG. 5C, the sacrificial layers 61 are removed through the second openings OP2. The first openings OP1 may be reopened by selectively etching the sacrificial layers 61. The reopened first openings OP1 may be respectively connected to the second openings OP2. When the first sub-channel structure is formed in advance instead of the sacrificial layers 61, the process of removing the sacrificial layers 61 may be omitted, and a next process may be performed.

Subsequently, channel structures CH are formed in the first and second openings OP1 and OP2. The channel structures CH may penetrate the cell region CR of a stack structure ST, and extend down to the base 50. Each of the channel structures CH may include a channel layer 54A, a memory layer 55A, and a gap fill layer 56A. Accordingly, the first sub-channel structure penetrating the first sub-stack structure ST1 and a second sub-channel structure penetrating the second sub-stack structure ST2 may be simultaneously formed. When the first sub-channel structure is formed in advance instead of the sacrificial layers 61, the second sub-channel structure is formed in the second openings OP2. A first channel layer of the first sub-channel structure and a second channel layer of the second sub-channel structure may be connected to each other.

Stop structures SP are formed in the third openings OP3. The stop structures SP may partially penetrate the contact region CTR of the stack structure ST. The stop structures SP may penetrate the second sub-stack structure ST2. The stop structures SP may be formed when the channel structures CH are formed. Each of the stop structures SP may include a dummy channel layer 54D, a dummy memory layer 55D, and a dummy gap fill layer 56D.

Figure 5D:
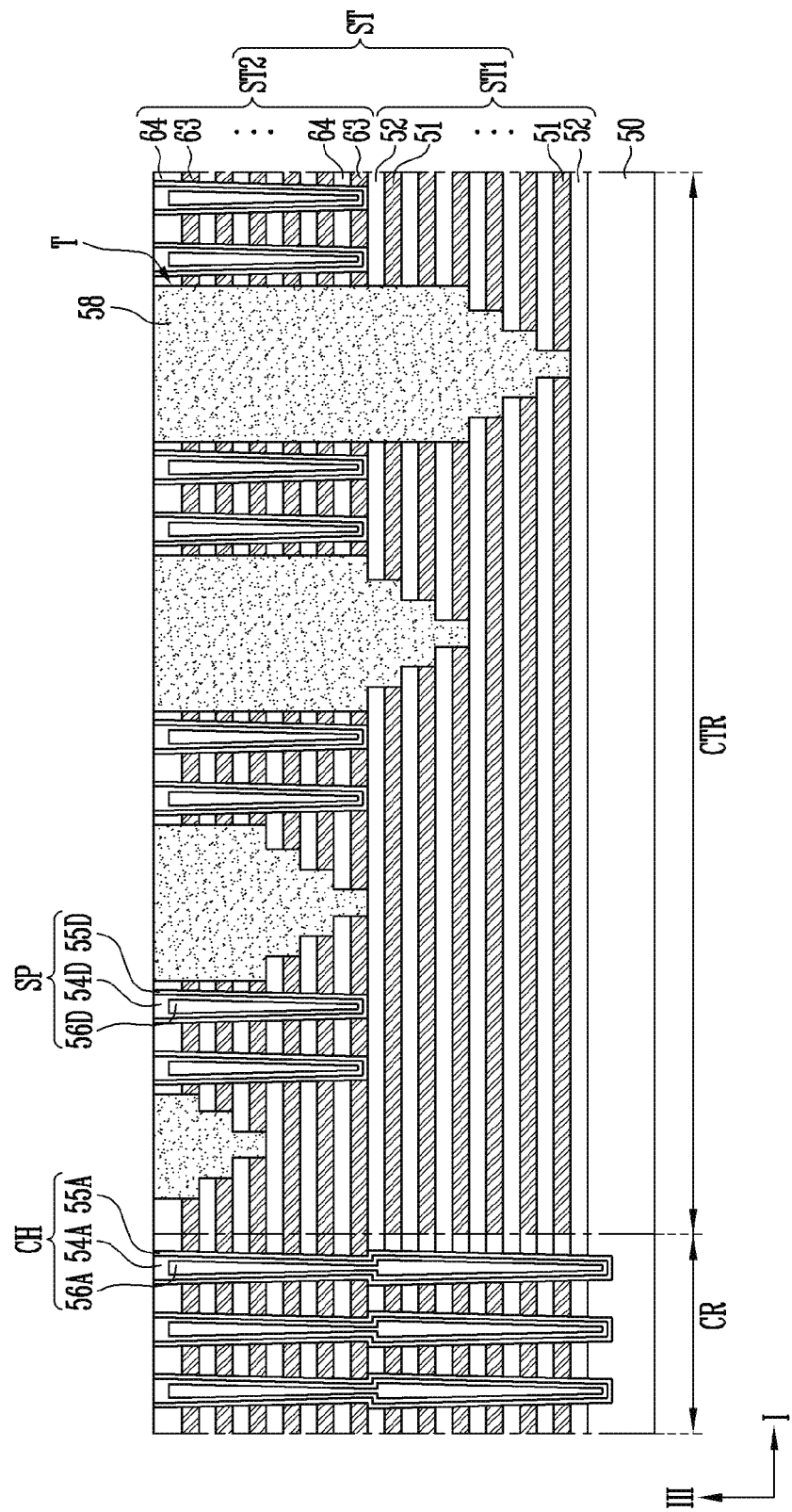

Referring to FIG. 5D, trenches T having different depths are formed. Subsequently, after an insulating material is formed on the stack structure ST, insulating patterns 58 are formed by planarizing the insulating material. In the planarization process, polishing may be stopped by using the stop structures SP or by using the stop structures SP and the channel structures CH.

Subsequently, an additional process may be performed according to materials of the channel structures CH, the first material layers 51, and the third material layers 63. The additional process is similar to that described with reference to FIG. 4D, and therefore, its description will be omitted.

FIG. 6 is a block diagram illustrating a configuration of a memory system in accordance with an embodiment of the present disclosure.

Referring to FIG. 6, the memory system 1000 in accordance with an embodiment of the present disclosure includes a memory device 1200 and a controller 1100.

The memory device 1200 is used to store data information having various data formats such as texts, graphics, and software codes. The memory device 1200 may be a nonvolatile memory. Also, the memory device 1200 may have the structures described with reference to FIGS. 1A to 6D, and be manufactured according to the manufacturing methods described with reference to FIGS. 1A to 6D. In an embodiment, the memory device 1200 may include: a stack structure including a cell region and a contact region; channel structures penetrating the cell region of the stack structure; trenches penetrating the contact region of the stack structure to different depths; a stop structure penetrating the contact region of the stack structure, the stop structure being located between the trenches. The structure and manufacturing method of the memory device 1200 are the same as described above, and therefore, their detailed descriptions will be omitted.

The controller 1100 is connected to a host and the memory device 1200, and is configured to access the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with an embodiment of the present disclosure includes the memory device 1200 having an improved degree of integration and improved characteristics, and thus the degree of integration and characteristics of the memory system 1000 can be improved.

FIG. 7 is a block diagram illustrating a configuration of a memory system in accordance with an embodiment of the present disclosure. Hereinafter, descriptions of contents overlapping with those described above will be omitted.

Referring to FIG. 7, the memory system 1000' in accordance with an embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 5D, and be manufactured according to the manufacturing methods described with reference to FIGS. 1A to 5D. In an embodiment, the memory device 1200' may include: a stack structure including a cell region and a contact region; channel structures penetrating the cell region of the stack structure; trenches penetrating the contact region of the stack structure to different depths; a stop structure penetrating the contact region of the stack structure, the stop structure being located between the trenches. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with an embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

FIG. 8 is a block diagram illustrating a configuration of a computing system in accordance with an embodiment of the present disclosure. Hereinafter, description of contents overlapping with those described above will be omitted.

Referring to FIG. 8, the computing system 2000 in accordance with an embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. Also, the memory device 2100 may have the structures described with reference to FIGS. 1A to 5D, and be manufactured according to the manufacturing methods described with reference to FIGS. 1A to 5D. In an embodiment, the memory device 2100 may include: a stack structure including a cell region and a contact region; channel structures penetrating the cell region of the stack structure; trenches penetrating the contact region of the stack structure to different depths; a stop structure penetrating the contact region of the stack structure, the stop structure being located between the trenches. The structure and manufacturing method of the memory device 2100 are the same as described above, and therefore, their detailed descriptions will be omitted.

The memory device 2100 may be a multi-chip package including a plurality of memory chips as described with reference to FIG. 7.

The computing system 2000 configured as described above may be a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with an embodiment of the present disclosure includes the memory device 2100 having an improved degree of integration and improved characteristics, and thus characteristics of the computing system 2000 can also be improved.

FIG. 9 is a block diagram illustrating a configuration of a computing system in accordance with an embodiment of the present disclosure.

Referring to FIG. 9, the computing system 3000 in accordance with an embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. Also, the memory device 3500 may have the structures described with reference to FIGS. 1A to 5D, and be manufactured according to the manufacturing methods described with reference to FIGS. 1A to 5D. In an embodiment, the memory device 3500 may include: a stack structure including a cell region and a contact region; channel structures penetrating the cell region of the stack structure; trenches penetrating the contact region of the stack structure to different depths; a stop structure penetrating the contact region of the stack structure, the stop structure being located between the trenches. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with an embodiment of the present disclosure includes the memory device 3500 having an improved degree of integration and improved characteristics, and thus characteristics of the computing system 3000 can also be improved.

In accordance with the present disclosure, there can be provided a semiconductor device having a stable structure and improved reliability. Further, when the semiconductor device is manufactured, the level of difficulty of processes can be lowered, manufacturing procedures can be simplified, and manufacturing cost can be reduced.

The examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
   a stack structure including a cell region and a contact region;
   a channel structure penetrating the cell region of the stack structure;
   trenches penetrating the contact region of the stack structure to different depths; and
   a stop structure penetrating the contact region of the stack structure, the stop structure being located between the trenches,
   wherein the stop structure includes:
   a dummy channel layer penetrating a part of the stack structure;
   a dummy memory layer surrounding a sidewall of the dummy channel layer; and
   a dummy gap fill layer in the dummy channel layer, and
   wherein the dummy channel layer protrudes toward a bottom of the stack structure more than the dummy memory layer.

2. The semiconductor device of claim 1, wherein regions of the stack structure located between the trenches and within the contact region have a uniform height.

3. The semiconductor device of claim 1, wherein the sidewall of the dummy channel layer includes at least one inflection point.

4. The semiconductor device of claim 1, further comprising insulating patterns formed in the trenches.

5. The semiconductor device of claim 4, wherein upper surfaces of the insulating patterns and an upper surface of the stop structure are located at substantially the same level.

6. The semiconductor device of claim 1, wherein the stop structure penetrates the stack structure to a partial depth.

7. A semiconductor device comprising: a first sub-stack structure; a second sub-stack structure on the first sub-stack structure; a channel structure including a first sub-channel structure penetrating the first sub-stack structure and a second sub-channel structure penetrating the second sub-stack structure; trenches penetrating the second sub-stack structure to different depths; and a stop structure penetrating the second sub-stack structure, the stop structure being located between the trenches, wherein the first sub-stack structure extends from a bottom of the stop structure to define the bottom of the stop structure.

8. The semiconductor device of claim 7, wherein regions of the second sub-stack structure located between the trenches have a uniform height.

9. The semiconductor device of claim 7, wherein the stop structure and the second sub-channel structure have substantially the same height.

10. The semiconductor device of claim 7, wherein the stop structure includes:
   a dummy channel layer penetrating the second sub-stack structure;
   a dummy memory layer surrounding a sidewall of the dummy channel layer; and
   a dummy gap fill layer in the dummy channel layer.

11. The semiconductor device of claim 7, wherein the stop structure includes:
   a contact plug penetrating the second sub-stack structure; and
   an insulating spacer surrounding a sidewall of the contact plug.

12. The semiconductor device of claim 7, further comprising insulating patterns formed in the trenches.

13. The semiconductor device of claim 12, wherein upper surfaces of the insulating patterns and an upper surface of the stop structure are located at substantially the same level.

14. A semiconductor device comprising:
   a stack structure including a cell region and a contact region;
   a channel structure penetrating the cell region of the stack structure;
   trenches penetrating the contact region of the stack structure to different depths; and
   a stop structure penetrating the contact region of the stack structure, the stop structure being located between the trenches,
   wherein the stop structure includes:
   a dummy channel layer penetrating the stack structure;
   a dummy memory layer surrounding a sidewall of the dummy channel layer and extending to cover a bottom of the dummy channel layer; and
   a dummy gap fill layer in the dummy channel layer.

15. The semiconductor device of claim 14, wherein regions of the stack structure located between the trenches and within the contact region have a uniform height.

16. The semiconductor device of claim 14, wherein the sidewall of the dummy channel layer includes at least one inflection point.

17. The semiconductor device of claim 14, further comprising insulating patterns formed in the trenches.

18. The semiconductor device of claim 17, wherein upper surfaces of the insulating patterns and an upper surface of the stop structure are located at substantially the same level.

19. The semiconductor device of claim 14, wherein the stop structure penetrates the stack structure to a partial depth.

* * * * *